United States Patent [19]

Gordon et al.

[11] Patent Number: 4,758,963
[45] Date of Patent: Jul. 19, 1988

[54] MODULAR COMPUTING OSCILLOSCOPE WITH HIGH SPEED SIGNAL MEMORY

[75] Inventors: Bernard M. Gordon, Gloucester; Arthur W. Crooke, Concord; Colin Gyles, Boxford; Edwin E. Stebbins, Boston; Evan Colton, Lynnfield, all of Mass.

[73] Assignee: Analogic Corporation, Peabody, Mass.

[21] Appl. No.: 52,126

[22] Filed: May 15, 1987

Related U.S. Application Data

[63] Continuation of Ser. No. 890,801, Jul. 24, 1986, abandoned, which is a continuation of Ser. No. 796,513, Nov. 8, 1985, abandoned, which is a continuation of Ser. No. 418,188, Sep. 14, 1982, abandoned.

[51] Int. Cl.$^4$ ............... G06F 15/20; G06F 15/31
[52] U.S. Cl. ............... 364/481; 324/113; 340/721; 364/487; 364/900; 365/231
[58] Field of Search ............... 364/481, 483, 487, 550, 364/580, 200, 900; 324/111–113; 340/721, 722; 365/231, 235

[56] References Cited

U.S. PATENT DOCUMENTS

| | | | |
|---|---|---|---|
| 3,560,942 | 2/1971 | Enright, Jr. | 365/231 X |
| 4,065,664 | 12/1977 | Kristof et al. | 364/487 |
| 4,072,851 | 2/1978 | Rose | 364/487 |
| 4,093,995 | 6/1978 | Smith et al. | 364/900 |
| 4,104,725 | 8/1978 | Rose et al. | 364/487 |
| 4,257,043 | 3/1981 | Tsuchiko | 340/721 X |
| 4,307,393 | 12/1981 | Hamada et al. | 340/721 X |
| 4,331,962 | 5/1982 | Neumann | 340/721 X |
| 4,373,193 | 2/1983 | Haag et al. | 364/900 |

OTHER PUBLICATIONS

"Computer Architecture Makes Oscilloscope into Measurement System", Computer Design, Oct. 1980, pp. 56–58.

"Internal Computer Automates Oscilloscope"; Rolfe, David; Electronic Product Design; Oct. 1980; pp. 45–48.

"Measurement Computer Eases Waveform Analysis"; Sapankevych, Stebbins, Levy, and Crooke; Electronics, Sep. 22, 1981, pp. 113–120.

*Primary Examiner*—Parshotam S. Lall
*Assistant Examiner*—Kevin J. Teska
*Attorney, Agent, or Firm*—David W. Gomes

[57] ABSTRACT

An oscilloscope to sequentially store, process and display an electrical input signal according to various signal events and characteristics. The oscilloscope is physically and functionally modular having both selectable hardware configurations from among various "plug-in" modules and selectable processing and display features chosen from among a predetermined selection by software control contained, in part, within the plug-in modules. The particular control settings, as well as a representation of the signal itself, is recorded on a removable storage device, such as a magnetic disc. High frequency signals are sampled, digitized and stored in a high speed intercascaded signal memory, independent from the program and data memory associated with the oscilloscope signal processing.

3 Claims, 4 Drawing Sheets

MODULAR COMPUTING OSCILLOSCOPE WITH HIGH SPEED SIGNAL MEMORY

This is a continuation of co-pending application Ser. No. 890,801, filed on 7/24/86, now abandoned, which is a continuation of co-pending application Ser. No. 796,513, filed on 11/8/85, now abandoned, which is a continuation of co-pending application Ser. No. 06/418,188, filed on Sept. 14, 1982, now abandoned.

FIELD OF THE INVENTION

The present invention relates to digital oscilloscopes and more particularly to oscilloscopes including digital signal processing apparatus.

BACKGROUND OF THE INVENTION

The desirability of viewing representations of signals and their signal characteristics either alone or in the context of other signals or events has increased significantly over the years. The importance of visual representation has been increased by the multiple analytical methods which have been implemented with fewer and fewer hardware components. More recently, it has been possible to include these signal analyzers within the body of the oscilloscope to provide complex signal analysis within a relatively limited physical dimension. The signal characteristics which can be displayed arise from generalized sampled data measuring instruments included within the oscilloscope. Time domain instruments such as digital storage oscilloscopes, also provide computing capabilities such as rise-time, fall-time and pulse-width as well as additional signal processing capabilities including filtering, spectrum analysis such as Fast Fourier Transform (FFT) and long term signal storage for later recall and comparison. Signal processing computers provide additional signal measurement and parameter display capabilities. However, a digital computing oscilloscope incorporating all the above features cannot merely aggregate the individual instrument functions. Generalized expansion of the oscilloscope facility results in an instrument as unwieldly as an entirely analog oscilloscope of the same capability having every parameter adjustment assigned to a particular control among many controls. Each new function, with its particular analog signal processing and control characteristics makes different requirements on the oscilloscope facilities. The functions must be integrated in a coherent manner to cooperate with each other.

One approach is to reduce the flexibility of each function to limit the number of controls by which the operator may adjust the instrument. However, the sacrifice of flexibility is typically the opposite of what the instrument was created to provide.

An alternate approach is to generalize the system wherein its function is determined according to a general computer program. One such system may comprise a microcomputer and a rack of IEEE 488 bus-compatible instruments. The user must be a programmer familiar with the use of each of the instruments and the specific communication protocol. A further disadvantage that often results in such systems is that important parameters become embedded in the program and are accessible only by tedious reassembly process. Checkout becomes difficult when the immediate results cannot be easily scrutinized. In such systems, the functions retain their flexibility but it is the user group which is limited, primarily to a group sophisticated in the particular system assembled.

In digital controlled equipment, when the proper parameter values have been established and the data taken for a particular reading, it is often necessary to reestablish and review the event occurrence. This is complicated through the need to readjust the oscilloscope to various settings at several different sequential periods during the test operation. Moreover, comparisons to prior test results, such as comparison of one signal to a prior signal, has heretofor been limited to large scale computer systems, and not for laboratory test instruments where they would be most useful.

Furthermore the signal to be measured by a digital oscilloscope must be sampled with high accuracy and resolution in both sample amplitude and sample time period. Ultimately, the digital oscilloscopes' processing capability are limited by the input signal frequency and resolution accuracy.

BRIEF DESCRIPTION OF THE INVENTION

The oscilloscope according to the present invention incorporates a display providing a visual indication of an accurately sampled signal which is then proecessed according to particular selected processes and parameters. Both the main processing system and the display are housed in a mainframe unit which also includes additional control switches and a recepticle to receive a modular unit. The modular unit may be configured in alternate versions (not shown) to each provide a specific function and/or signal processing capability. Moreover, the modular unit is adapted to provide additional signal conditioning and measurement control such as input signal ground isolation.

In particular, the modular units receive the analog input signals and provide for analog conditioning prior to the A to D conversion. In particular, the modular unit includes an amplifier to increase a low level signal and an attenuator to attenuate a signal of excessive amplitude. The modular unit also includes circuitry to transfer the conditioned or adjusted signal as well as the parameter settings to the mainframe and subsequently to the display unit. The signal transferred in this manner may be a sampled and digitized signal or it may be additionally processed or conditioned by techniques known in the art. The sampled signal forms a signal representation to be stored in a memory which may be within the plug-in unit as shown here, or in the mainframe memory (not shown) of the processor and recalled to provide an accurate representation of the signal for further processing and display on the oscilloscope according to the particular selected parameters. The modular unit also includes a memory program storage element which when connected to the main processing circuitry enables the oscilloscope to function according to a selected particular process when the oscilloscope is operated. Moreover, the main processing system initiates a power-up sequence which initializes the various elements of the processing system. The main processing system scans the memory contained in each particular modular unit and identifies therein the particular processing capability of that unit. The processing system then displays an appropriate alphanumeric label and numeric value on the display indicating to the user the particular oscilloscope plug-in unit housed and the work capabilites of that unit.

Typically, the plug-in includes an analog to digital convertor (ADC) wherein the received analog input signal is converted to a digital representation thereof and stored or directly passed to the main processing system for visual display. The main processing system comprises a digital computer. The digital computer is implemented with a microprocessor. The digital computer is housed in the mainframe of the oscilloscope and is programmed to perform several mathematical operations on the digital signal representation. Each operation may comprise known computer implemented signal processes. The process or processes are selectable and alterable according to front panel switches from among the particular program stored in the read-only memory program stored. Particular plug-in unit parameters are controlled by programs stored in the plug-in unit, and general operations are selected from among the processes available by programs stored in the mainframe.

A wide variety of functions may be performed having minimal computer redundancy and complexity combined with a flexible oscilloscope system capable of performing a virtually unlimited processing and analysis function including the known processes mentioned above. In addition, the mathematical functions performed by the oscilloscope according to the present invention may be concatenated or chained together to provide a complex signal processing system which is responsive to a particular signal. Moreover, as the signals change, the processing is a continuously renewed or updated. The values resulting from the mathematical computation on the representative signal are adjusted by prescaling before the signal is displayed on the display means, to insure the maximum resolution of the signal on display without extending beyond the edge of the display. The oscilloscope provides labeled coordinate axes having the prescaled coordinants displayed along with the signal representation on the display surface.

Additional features of the oscilloscope according to the present invention include self diagnostic system checks residing within the main processing system and the particular plug-in module. Upon a system or signal input failure, the processing system provides an appropriate user message on the display device. Moreover, the particular signal values, parameters and system processes employed during a particular operation may be stored on a long-term removable storage device, such as magnetic tape or disc memories. The memories may then be used in the future to restore the system to a previously predetermined operating arrangement.

The particular embodiment of the oscilloscope shown also includes a high speed signal memory within the plug-in module to retain the sampled signal representation separate from the memory associated with the computer processes. The separation of the stored sampled signal data in the high speed memory within the plug-in module and the computer data memory within the oscilloscope mainframe allows repeated recalculation of values from the original sampled signal values without information loss through signal processing of the original data. The high speed signal memory comprises an intercascaded memory having significant improvement in operational speed and a reduced power consumption in comparison to the standard random-access architecture.

BRIEF DESCRIPTION OF THE DRAWING

These and other features of the present invention will be better understood by reading the following detailed description along with the drawing wherein.

DETAILED DESCRIPTION OF THE PRESENT INVENTION

Figure 1:
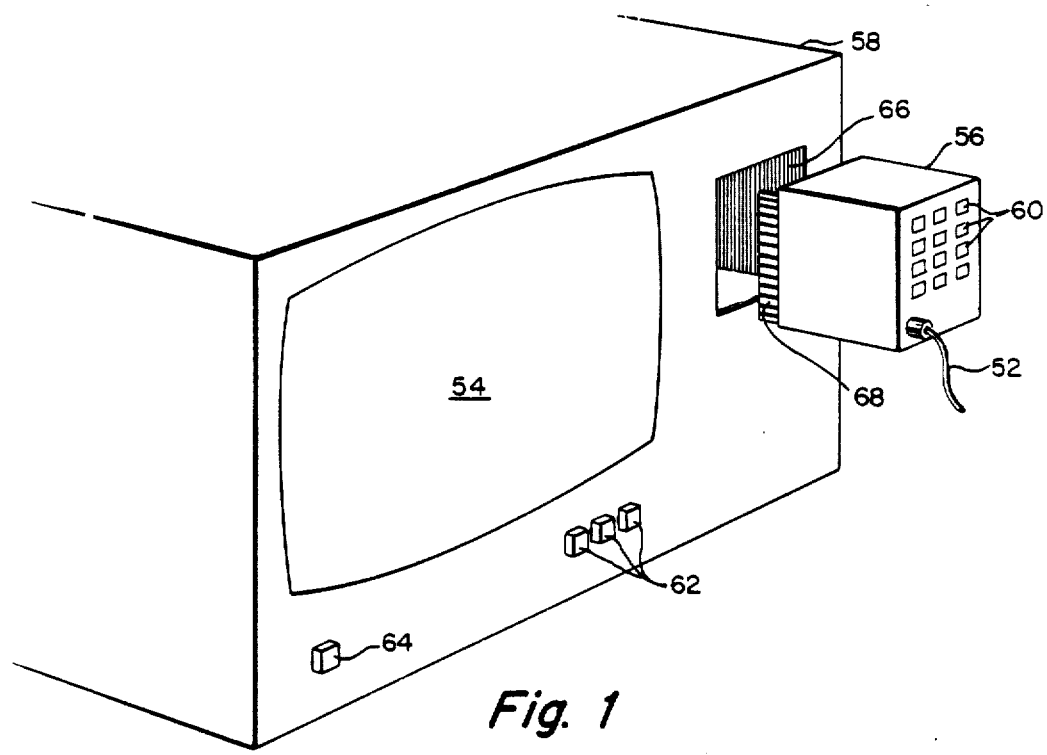
FIG. 1 is a front view of the oscilloscope.

The digital computing oscilloscope according to the present invention and shown in FIG. 1 displays signals received by a signal input 52 on a display 54. The signal received is first conditioned, sampled, and digitized by plug-in unit 56. The plug-in unit 56 stores the sampled signal in a signal memory and is subsequently transferred to processing equipment within the mainframe 58 which also houses the display 54 and a plurality of operator controls discussed below. Some user controls are keys 60 located on the module 56; programable keys 62 and power switch 64 are located on the oscilloscope mainframe 58. The plug-in 56 is received by the mainframe 58 through an opening 66 to which the plug-in 56 extends a plug 68 to mate with a corresponding recepticle (not shown) within the mainframe 58.

Figure 2:
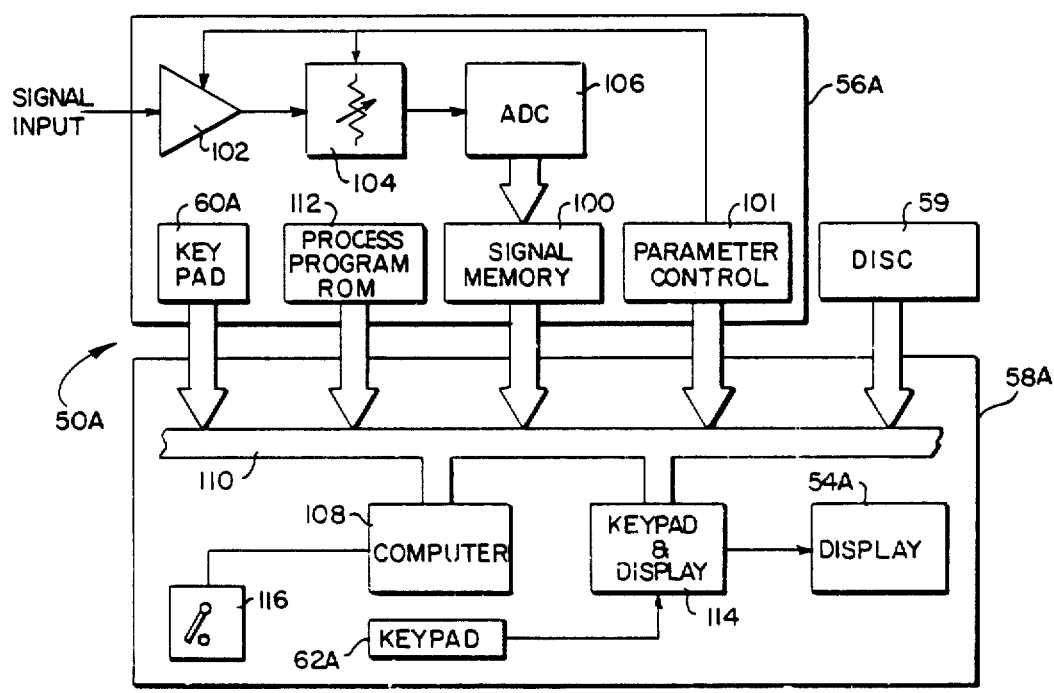
FIG. 2 is a block diagram of the oscilloscope.

The block diagram of the oscilloscope 50 is shown in FIG. 2. The plug-in 56A and mainframe 58A corresponds with the plug-in 56, with the mainframe 58 of FIG. 1. The plug-in 56A includes analog conditioning circuit 102 and typically comprising filtering, voltage isolation, off-set adjustments and other analog functions known in the art. The signal is also adjusted in amplitude by attenuator circuit 104 before being sampled and converted to a digital signal by an analog to digital convertor (ADC) 106. Additional input channels are part of the present invention, and although they are not shown, they are identical up to the ADC 106, which has a selector (discussed below) to select among different analog inputs. The resulting digital signals as well as the module parameter settings are stored within a signal memory 100 and in turn transferred to the mainframe 58A processing computer 108 according to the digital computer bus 110. The plug-in unit 56A also includes the keys 60A having a plurality of user operated controls. The keys 60A include interface circuitry to transfer the corresponding signals to the computer bus 110. The plug-in includes a process program read only memory (ROM) 112 which is then connected to the computer bus 110. The program contained within the ROM 112 directs the particular computer processes selected by the operator according to the operator controls, which include the keys 60A. The selected process is performed by the computer 108 according to the program stored within ROM 112 include designation of particular functions within the user control group 62A corresponding to the keys 62 of FIG. 1. The keys 62A are connected to the computer bus 110 by interface circuits 114, which also provides analog signals to the CRT display 54A. The recorded and processed digital signals the user-selected oscilloscope functions and module parameter values (through control 101) are stord on an external memory device, such as a disc unit 59, connected to communicate with the oscilloscope through the bus 110. The analog circuits 102 and 104, and the interconnection of the digital circuits 60A, 112, 101, 108, 62A and 114 are generally known in the art and not discussed here. Moreover, although the interconnection of signal memory 100 to the computer bus 110 is known in the art, the internal architecture of the signal memory 100 is part of the present invention, and is discussed further below.

According to the present invention, the computer 108 comprises a microprocessor and an associated data and program memory (not shown) and is implemented by components available to those skilled in the art. The program ROM 112 within the plug-in module 56A augments the computer data program memory by occupying a particular location in the memory space to which the computer 108 microprocessor can access through the bus 110. Similarly, resident within each program ROM 112 is a particular identifier code corresponding to the mathematical and functional capabilities which may be performed by the mainframe computer 108 while the selected plug-in 56A is engaged on the computer bus 110. The particular software capabilities are not part of this invention. The computer 108 also provides a visual indication on the display 54A of the particular programs available within the program ROM 112 by included circuitry to detect when the on-off switch 116 is operated. Moreover, the list of available programs can be recalled and displayed when one or more of the appropriate keys 62A or 60A is actuated. Also included within the computer 108 are diagnostic programs which provide diagnostic information to the display 54A relating to the existence and character of a malfunction of the computer 108 or other oscilloscope 50 elements.

The particular processes available within the oscilloscope 50 include processing and display of representative signal values according to a variety of known mathematic processes. These processes may be concatinated wherein various equations may be subsequently used to provide multiple mathematical processes to be performed on a particular signal. The processes may be arranged in a particular combination or sequence according to a user selection of controls, which include the push buttons within keys 60A and 62A. Also, as further signals are received by the oscilloscope 50, the processes may be recomputed on a continuous basis to display a composite signal on the display device 54A. A typical mathematical process includes the trend analysis function known in the art. Other mathematical processes include geometric computations, time differentials and intervals of particular signals. The computer also generates a coordinate signal to the display 54 which provides visual indication of coordinate axes and numeric labels spaced at scale intervals on the axes, corresponding to the axis parameter value at the intervals.

Figure 3:
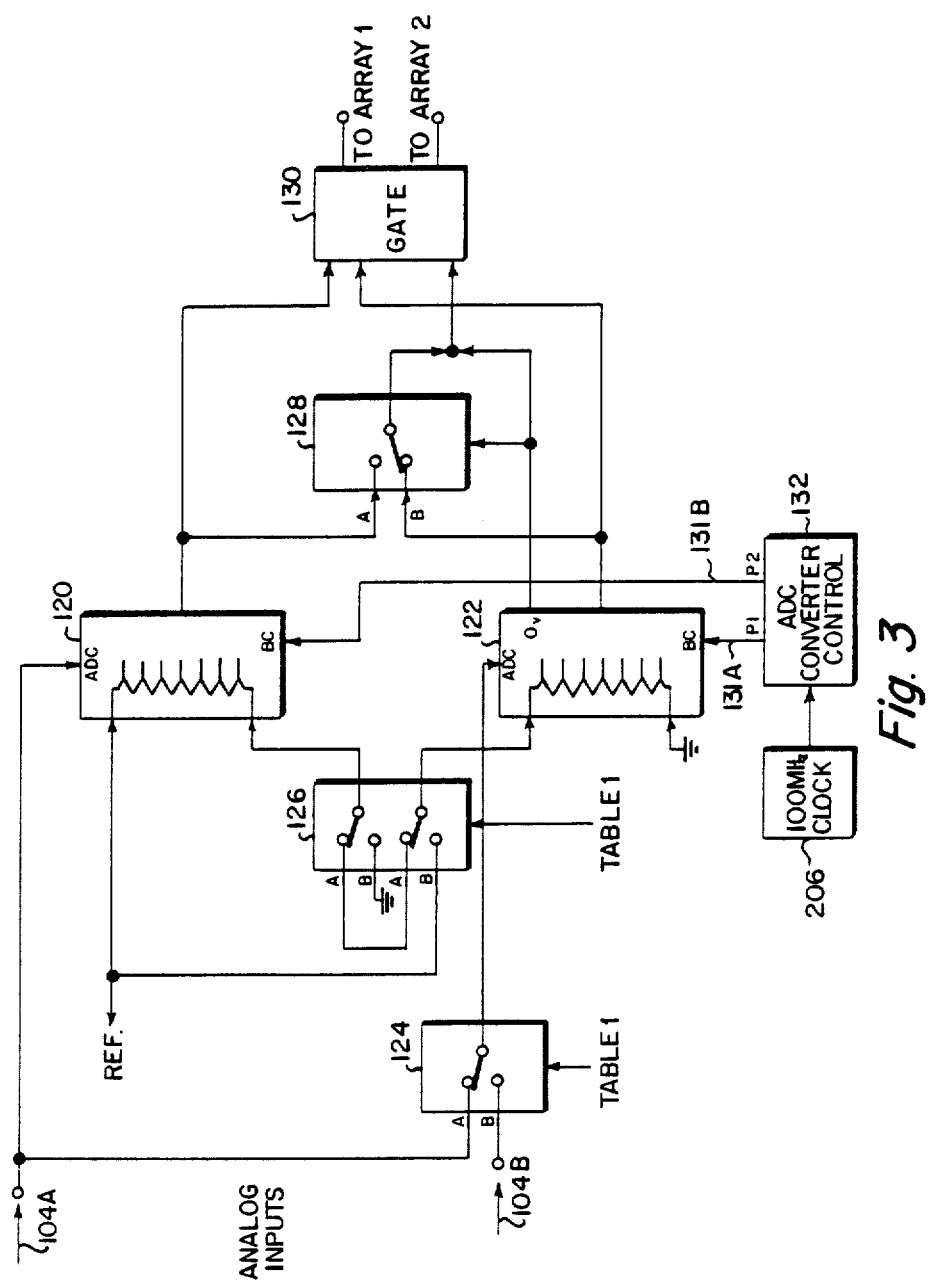
FIG. 3 is a block diagram of the analog to digital conversion unit of FIG. 2.

The elements of ADC unit 106 of FIG. 2 are shown in the block diagram 106A of FIG. 3. The ADC unit 106 is selectable to operate in one of three modes: one channel 100 MHz 7 bit resolution; one channel 50 MHz 8 bit resolution; and two channel 50 MHz 7 bit resolution, discussed below.

The wires interconnecting the elements of the digital elements typically comprise a plurality of wires, typically 8 or 16 wires in parallel, and for reasons of clarity will be shown in the figures as a single line. Moreover, the number of conductors associated with each element may be varied as desired in alternate embodiments. The analog inputs from attenuator 104 and others (not shown) are received by ADC element 120 and by ADC elements 122 through switch 124 in position A. Alternately, a second analog channel is received through switch 124, in position B. The ADC elements 120 and 122 receive reference signals through switch 126. When switch 126 is in position A, the voltage dividers within each ADC element 120 and 122 are connected in series to form single voltage divider; each ADC element provides the least significant bits (LSB) and the overflow signal from ADC element 122 provides the most significant bit (MSB). Switch 128 selects one of the ADC element (120 or 122) output signals according to the overflow signal: ADC element 122 output is selected unless an over flow is indicated, whereupon ADC element 120 output is selected. The memory arrays 210 and 250 of FIG. 4 receive the representative digital signals through switch 130. The (combined) 8 bit output is selected when the 8 bit resolution is desired, or each individual ADC element (120 or 122) output is simultaneously selected when two channel operation is selected, or sequentially selected by both memory arrays 210 and 250 when in high speed (100 MHz) mode.

The switches 124, 126 and gate 130 are operable either manually or under computer 108 program control through bus 110; the gate and switches including switch 128 are implemented by solid state (or other) switches known in the art. The ADC elements 120 and 122 each provide a digital output upon the occurrance of a "begin conversion" signal from ADC controller 132, which receives a signal from the high frequency (100 MHz) oscilloscope clock 206. The relative phase relationship between the "begin conversion" signals 131A and 131B is selectable to coincide or be offset by 180°, according to whether a 50 MHz or 100 MHz data rate is desired. When the ADC elements 120 and 122 are operated out of phase with a common input signal, and in conjunction with the memory 100 discussed below, the oscilloscope effectively receives, samples, digitizes and stores input signals at a 100 MHz data rate.

The ADC unit operates in one of three modes by selections of switch positions according to Table 1, below:

TABLE 1

| MODE | SWITCH 124 POSITION | SWITCH 126 POSITION | SIGNALS 131A, 131B PHASE |
|---|---|---|---|
| 1 Channel | | | |
| 100 MHZ 7 BIT | A | B | 180° |
| 50 MHZ 8 BIT | A | A | 0° |
| 2 Channel | | | |
| 50 MHZ 7 Bit | B | B | 0° |

Figure 4:
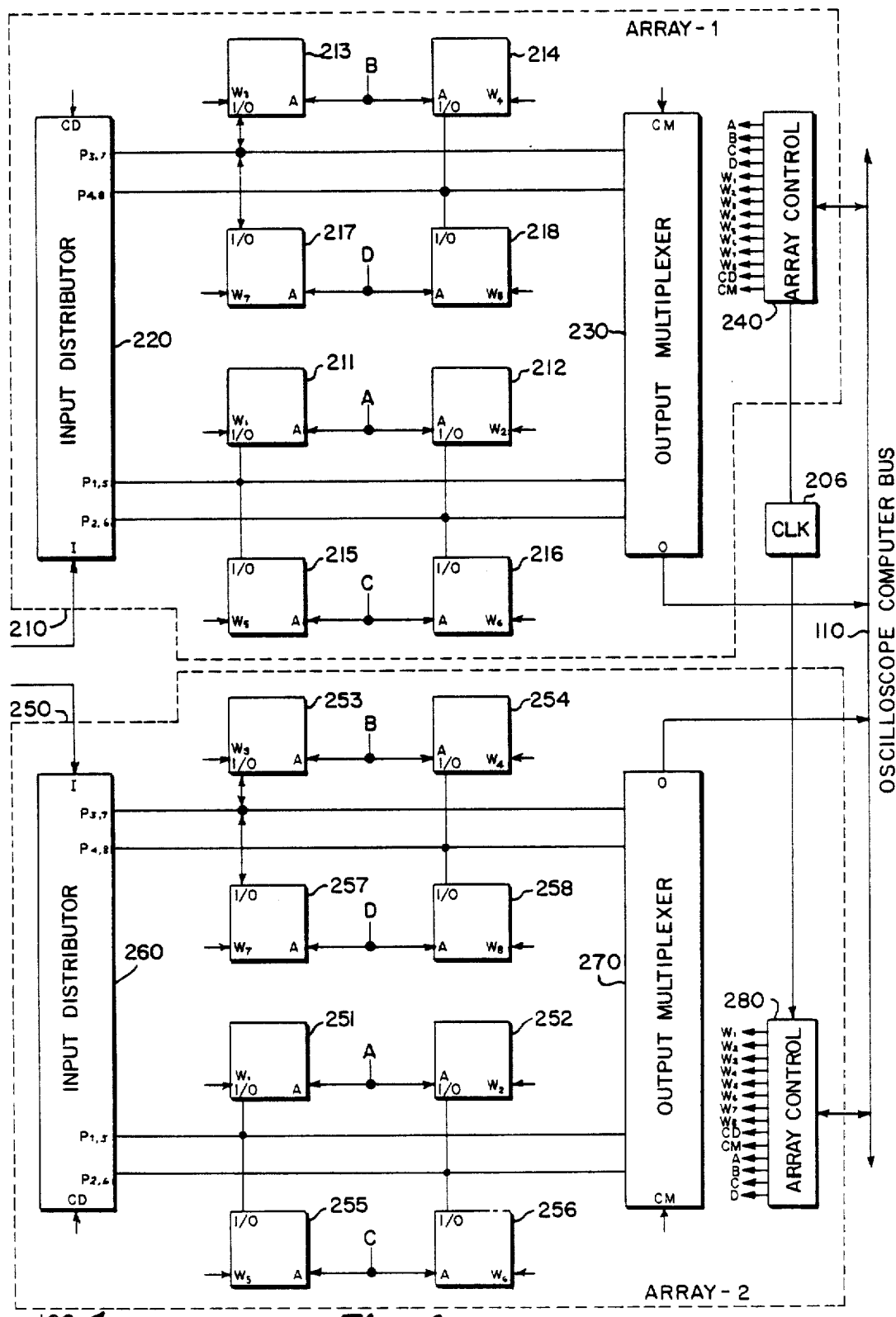
FIG. 4 is a block diagram of the high speed signal memory of FIG. 2.
Figure 5:
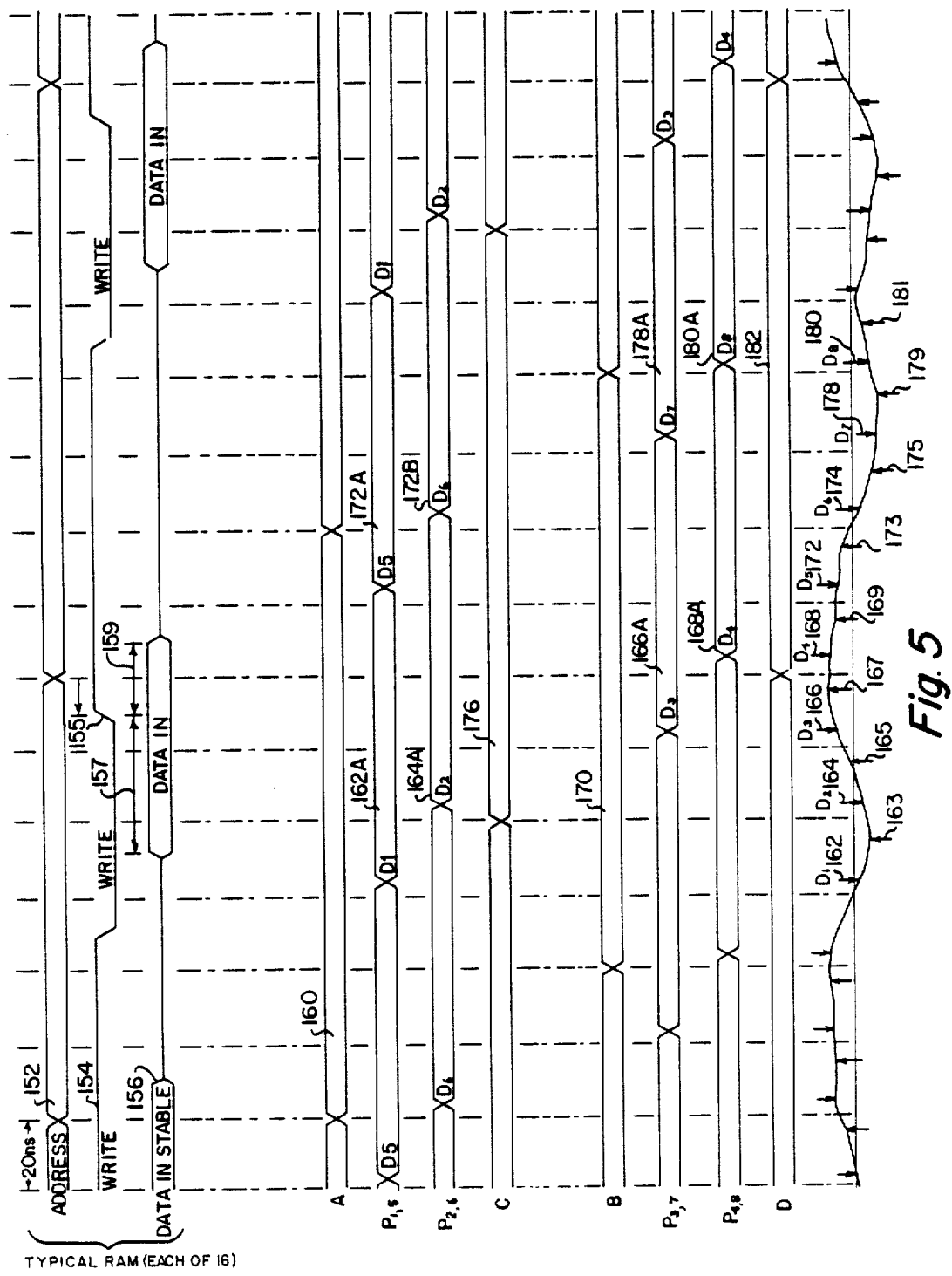
FIG. 5 is a timing diagram of the high speed signal memory of FIG. 4.

The particular implementation of the signal memory 100 is shown in the block diagram of FIG. 4. The timing diagram 150 of FIG. 5 shows the typical address times 152 write signal 154 and data input signals 156 of a single random access memory (RAM) and the addressed data signal timing relationship among the various RAM elements of the memory 100. The horizontal coordinate shows intervals of 20 nanoseconds (ns). For a typical RAM which requires the address signal to be stable for a time of 120 nanoseconds, the input data must typically be stable for approximately 60 nanoseconds, or one-half of the address time period 152. However, in the high frequency mode, the digital computing oscilloscope 50 provides a data stream 158 from the plug-in 56A at a much higher rate of 10 nanoseconds per data value. The signal memory 100 of the present invention combines sixteen RAMs, each having a characteristic shown by signals times 152, 154 and 156, to store a stream of data.

The signal memory 100 comprises two memory arrays 210 and 250, each being identical; however the memory arrays receive data in alternate sequence from the ADC unit 106 when in the 100 MHz mode. For clarity of explanation, except for the above mentioned differences, the memory array 210 and the memory array 250 operates in an identical manner. In the timing diagram 150 of FIG. 5, the signal values of 162, 164, 166, 168, 172, 174, 178 and 180 are received in digitized form by array 210; the signals 163, 165, 167, 169, 173, 175, 179 and 181 are received by array 250 of FIG. 4. The signal values 178, 179 etc, alternately are converted by the ADC unit 106, and received by the memory 100 to effectively sample the incoming oscilloscope signal at 10 nanosecond intervals. The alternately converted signals are received by input distributors 220 and 260 which route the respective data stream to one of eight memory elements within each array. The memory elements 211 through 218, and 251 through 258 respectively each comprise CMOS RAMs having the signal characteristics typified by signals 152, 154 and 156. The signals stored within the above mentioned elements are then selectively placed on the computer bus 110 by the operation of respective output multiplexers 230 and 270. The output multiplexers, and the memory elements are controlled by control elements 240 and 280 respectively. The operation of the array control elements and the input selector in gate 204 is operated according to a high frequency (100 MHz) clock 206. According to the present invention, the memory elements are multiplexed wherein two memory elements share each address signal, data input signal and data output signal path. Specifically, the eight memory elements receive four address signals A, B, C, and D generated by control 240, by arranging pairs of memory elements in the pairs 211 and 212, 213 and 214, 215 and 216, and 217 and 218 respectively. The corresponding elements 251 and 252, 253 and 254, 255 and 256, and 257 and 258 of array 250 receive the address signals A, B, C, and D, generated within array 250. The addresses B, C, and D are typically identical to address value A, but delayed in time as shown in FIG. 5. The input distributor signal output ports $P_{3,7}$ $P_{4,8}$ $P_{5,1}$ and $P_{2,6}$ are each connected to the corresponding input pairs of memory elements 213 and 217, 214 and 218, 211 and 215, and 212 and 216, respectively; the corresponding input signal of the array 250 is provided to each memory element input by the distributor 260 as shown in FIG. 4. This manner of shared memory element interconnections provides a particularly significant reduction in the number of logic elements associated with the data and address signals, which are the highest speed devices and the most power consuming. Therefore, the reduced use of power consuming devices results in a significant reduction in signal memory 100 power consumption. Typically, the input distributor 220 and 260, output multiplexers 230 and 270, and array control circuits 230 and 260 are implemented with TTL circuits, and the memory elements 211-218 and 251-258 are implemented with CMOS RAMs such as the Hitachi number HN6116LT manufactured by Hitachi Corporation of Japan.

The memory elements 211 and 212 share a common address signal A, shown in FIG. 4. According to the typical RAM specification shown in FIG. 5, the write signal trailing edge transition 155 must occur in a specified period of time before the change of address signal 152. At 150, a stable data input signal must exist for a period of time 157 before the occurance of the transistion 155, as well as for a period of time 159 thereafter. The sum of these two times 157 and 159 are typically equal to or less than one-half of the stable address time 152. It is also typical of RAMs that the signal transistion 155, and the stable data input signal time period 156 occur entirely before a change of the address 152 data. This is shown in timing diagram 150 as the particular address signal 160 relative to the two corresponding data input signals 162 and 164 from the input distributor 220 (or 260) signal ports $P_{1,5}$ and $P_{2,6}$ respectively. For a stable data input time period (equal to the sum of period 157 and 159) of approximately 60 nanoseconds, according to FIG. 5, the corresponding data input signals 162 and 164 exceed the minimum requirements as shown. Therefore, according to present invention, both memory elements 211 and 212 can selectively receive different input data according to signals from port $P_{1,5}$ and $P_{2,6}$ while receiving a common address signal A. The offset in time of the data input signals 162 and 164 of 20 nanoseconds is irrelevant to the particular RAM requirements so long as the data is stable for a minimum specified time, and occurs relative to the write signal transistion 155 and the address signal 152 transistion and as defined by the particular RAM selected. Addresses A, B, C and D are the same value but successively delayed in time. Similarly, the next two pieces of data 166 and 168 from the data stream are shown as signals 166A and 168A by the input distributor 220 ports $P_{3,7}$ and $P_{4,8}$. The signals 166A and 168A are then received by memory elements 213 and 214 respectively. The memory elements 213 and 214 share a common address B signal 170 wherein the signals 166A and 168A are stored within the memory 213 and 214. The data signals 172 and 174 are received by the memory elements 215 and 216 from the input distributor 220 output ports $P_{1,5}$ and $P_{2,6}$ as data signals 172A and 172B respectively. These signals are stored in the memory elements 215 and 216 according to the memory address C signal 176. The signals 178 and 180 of the data input are received by the memory elements 217 and 218 as signals 178A and 180A from the input distributor 220 ports $P_{3,7}$ and $P_{4,8}$ respectively. The input signals 178A and 180A are received and stored by the memories at the address D shown as the signal 182. The address signals A, B, C and D are provided by the array control 240 according to signals received from the computer bus 110. Similarly, each array memory element requires a write signal (not shown) corresponding to the typical write signal 154 shown in the timing diagram 150. The array memory write signals $W_1-W_8$ are produced within the array control 240. The array control produces a write signal 154 having a write pulse duration and transistion 155 to mmet or exceed the requirements of the respectively chosen RAM memory element. The relative timing of the write signals are adjusted to each corresponding data signal (such as signal 162A) timing position. Similarly, each memory element may also have a chip select (CS) signal input (not shown); the specific operation of the CS input signals are not material to the memory of the present invention. The array control 240 also provides the input distributor 220 with the appropriate control signals CD and the output multiplexer 230 with the corresponding control signals at lead CM. The input distributor 220, output multiplexer 230, array control 240 and clock 206 comprise digital circuitry known in the art, and not discussed in detail here. Moreover, the interface elements necessary to communicate with the computer bus 110 are selected to function within the particular computer bus parameters. Therefore, the present invention is not to be limited by modifications and alternate embodiments by those skilled in the art except as defined in the claims which follow.

What is claimed is:

1. For use in an oscilloscope having a computer including an interconnecting bus, an oscilloscope module comprising:

analog input means for receiving an input signal;

an analog-to-digital converter for converting said input signal to a digital signal; and an intercascaded memory array to store said digital signal, connected to said interconnecting bus and including a multiplicity of memory elements arranged for accessing in accordance with a predetermined sequence and divided into sequentially accessed groups of elements, means for addressing the elements in each group with the same addressing signal, means for generating first addressing signals and providing those signals to one of the groups of elements, and means for generating separate addressing signals for each of the subsequently accessed groups of elements including means for successively delaying the first addresssing signals between each subsequently accessed group of elements;

an input signal distributor for transferring digital signals to the memory elements in accordance with the predetermined sequence; and an output signal multiplexer for receiving output digital signals from the memory elements and providing an array output signal for the module.

2. The oscilloscope module of claim 1 wherein said input distributor includes a plurality of ports with each port being coupled to at least two of said memory elements and to the output multiplexer and with each said two elements not being sequentially adjacent in the predetermined sequence.

3. The oscilloscope module of claim 1, including:

a plurality of memory arrays, each array being selectively activated and including said plurality of elements, said input signal distributor and said output signal multiplexer.

* * * * *